(12) United States Patent
Tai et al.

(10) Patent No.: US 9,613,826 B2
(45) Date of Patent: Apr. 4, 2017

(54) SEMICONDUCTOR PROCESS FOR TREATING METAL GATE

(71) Applicant: UNITED MICROELECTRONICS CORP., Hsin-Chu (TW)

(72) Inventors: Cheng-Chi Tai, Taichung (TW); Chun-Ju Tao, Yunlin County (TW); Chung-Che Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/811,852

(22) Filed: Jul. 29, 2015

(65) Prior Publication Data

US 2017/0032975 A1 Feb. 2, 2017

(51) Int. Cl.
| | |
|---|---|
| *H01L 21/283* | (2006.01) |
| *H01L 21/3213* | (2006.01) |
| *H01L 29/51* | (2006.01) |
| *H01L 21/311* | (2006.01) |
| *H01L 29/66* | (2006.01) |
| *H01L 29/49* | (2006.01) |
| *H01L 21/768* | (2006.01) |
| *H01L 29/45* | (2006.01) |

(52) U.S. Cl.
CPC ...... *H01L 21/32136* (2013.01); *H01L 21/283* (2013.01); *H01L 21/31144* (2013.01); *H01L 21/76897* (2013.01); *H01L 29/45* (2013.01); *H01L 29/495* (2013.01); *H01L 29/517* (2013.01); *H01L 29/66477* (2013.01)

(58) Field of Classification Search
CPC ... H01L 21/28; H01L 21/336; H01L 21/8238; H01L 27/092; H01L 21/283; H01L 21/32136; H01L 21/31144; H01L 21/76897; H01L 21/4763; H01L 29/45
USPC ......................................... 438/299, 216, 593
See application file for complete search history.

(56) References Cited

U.S. PATENT DOCUMENTS

| | | | |
|---|---|---|---|
| 6,758,223 B1 | 7/2004 | Cowley | |
| 2003/0072884 A1* | 4/2003 | Zhang | C23C 16/14 427/255.391 |
| 2005/0233263 A1* | 10/2005 | Park | B82Y 30/00 430/324 |
| 2007/0178637 A1* | 8/2007 | Jung | H01L 21/823462 438/216 |
| 2009/0239374 A1* | 9/2009 | Kim | H01L 21/76826 438/631 |
| 2011/0024845 A1* | 2/2011 | Hirai | H01L 21/28079 257/369 |
| 2013/0240892 A1 | 9/2013 | Stenner | |
| 2014/0186544 A1* | 7/2014 | Hua | H01L 21/0217 427/534 |
| 2015/0299886 A1* | 10/2015 | Doubina | C25D 5/34 205/157 |
| 2015/0345028 A1* | 12/2015 | Wang | C23F 1/12 216/67 |

* cited by examiner

*Primary Examiner* — Chuong A Luu
(74) *Attorney, Agent, or Firm* — Winston Hsu; Scott Margo

(57) ABSTRACT

A semiconductor process for treating a metal gate includes the following steps. A metal gate including a main conductive material on a substrate is provided. A $H_2/N_2$ plasma treatment process is performed to reduce the main conductive material.

15 Claims, 4 Drawing Sheets

SEMICONDUCTOR PROCESS FOR TREATING METAL GATE

BACKGROUND OF THE INVENTION

1. Field of the Invention

The present invention relates generally to a semiconductor process for treating a metal gate, and more specifically to a semiconductor process for treating a metal gate applying plasma treatments to reduce metal gates.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In one aspect, in the conventional method of fabricating transistors, a gate structure is first formed on a substrate, and a lightly doped source/drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes. As the miniaturization of semiconductor devices increases, filling the contact plugs into contact holes has become an important issue to maintain or enhance the performances of formed semiconductor devices.

On the other hand, poly-silicon is conventionally used as a gate electrode in semiconductor devices, such as metal-oxide-semiconductor (MOS) transistors. With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

SUMMARY OF THE INVENTION

The present invention provides a semiconductor process for treating a metal gate, which performs a $H_2/N_2$ plasma treatment process to reduce the metal gate, thereby reducing ohmic contact resistance between the metal gate and a contact plug formed thereon.

The present invention provides a semiconductor process for treating a metal gate including the following steps. A metal gate including a main conductive material on a substrate is provided.

A $H_2/N_2$ plasma treatment process is performed to reduce the main conductive material.

According to the above, the present invention provides a semiconductor process for treating a metal gate, which performs a $H_2/N_2$ plasma treatment process to reduce the metal gate, especially for a main conductive material of the metal gate. Therefore, ohmic contact resistance between the metal gate and a contact plug formed thereon can be reduced.

These and other objectives of the present invention will no doubt become obvious to those of ordinary skill in the art after reading the following detailed description of the preferred embodiment that is illustrated in the various figures and drawings.

DETAILED DESCRIPTION

A semiconductor process of the present invention is applied to a CMOS transistor having a PMOS transistor paired with an NMOS transistor in the following embodiment. However, the present invention is not restricted thereto. The present invention can also be applied to a MOS transistor such as a planar MOS transistor, a non-planar MOS transistor, or others, depending upon practical requirements.

Figure 1:
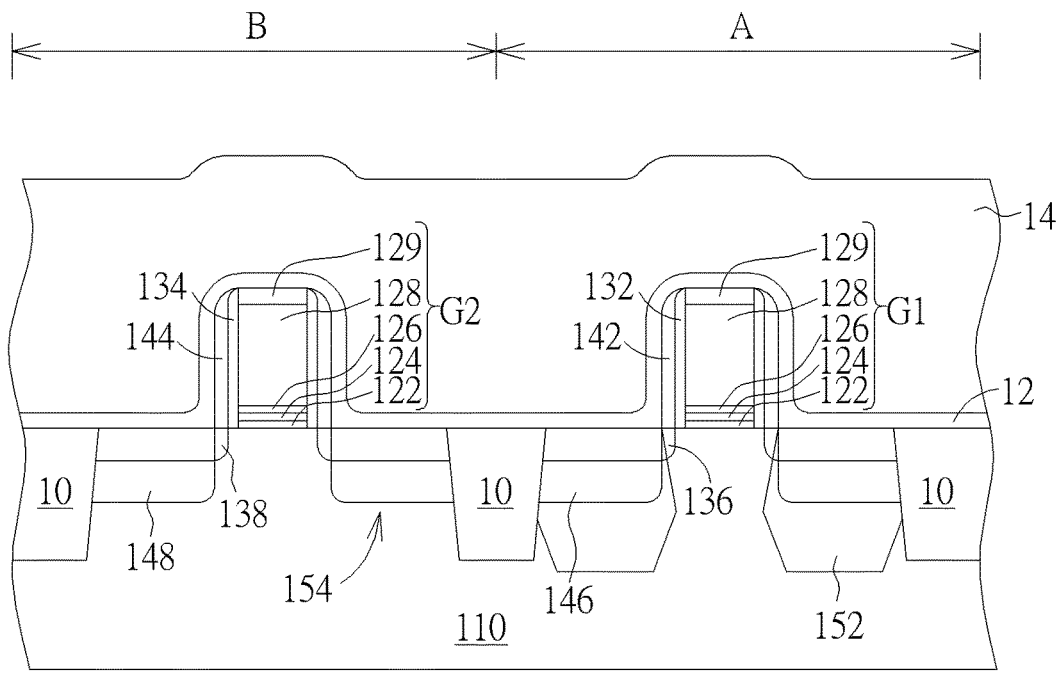
FIGS. 1-8 schematically depict cross-sectional views of a semiconductor process for treating a metal gate according to an embodiment of the present invention.

FIGS. 1-8 schematically depict cross-sectional views of a semiconductor process for treating a metal gate according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 may be formed in the substrate 110 to electrically isolate each transistor. The isolation structures 10 may be shallow trench isolation (STI) structures, which may be formed by a shallow trench isolation process, and the forming method is known in the art, and will not be described herein, but it is not limited thereto. In this embodiment, the substrate 110 is divided into a first area A and a second area B isolated by the isolation structures 10; the first area A serves as a PMOS transistor area while the second area B serves as an NMOS transistor area, but it is not limited thereto.

A buffer layer (not shown), agate dielectric layer (not shown), a barrier layer (not shown), a sacrificial electrode layer (not shown) and a cap layer (not shown) are sequentially formed from bottom to top and cover the substrate 110. The cap layer (not shown), the sacrificial electrode layer (not shown), the barrier layer (not shown), the gate dielectric layer (not shown) and the buffer layer (not shown) are patterned to form buffer layers 122, gate dielectric layers 124, barrier layers 126, sacrificial electrode layers 128 and cap layers 129 on the substrate 110. This means that sacrificial gates G1 and G2 including the buffer layers 122, the gate dielectric layers 124, the barrier layers 126, the sacrificial electrode layers 128 and the cap layers 129 are formed in the first area A and the second area B respectively.

Each of the buffer layers 122 may be an oxide layer, which may be formed through a chemical oxide process or a thermal oxide process, but it is not limited thereto. The buffer layer 122 is located between each of the gate dielectric layers 124 and the substrate 110 to buffer the gate dielectric layer 124 and the substrate 110. A gate-last for high-k first process is applied in this embodiment, so that each of the gate dielectric layers 124 is a gate dielectric layer having a high dielectric constant, which may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite (SrBi$_2$Ta$_2$O$_9$, SBT), lead zirconate titanate (PbZr$_x$Ti$_1$-xO$_3$, PZT) and barium strontium titanate (Ba$_x$Sr$_1$-xTiO$_3$, BST), but it is not limited thereto. In another embodiment, as agate-last for high-k last process is applied, each of the gate dielectric layers 124 will be removed in later processes and then a gate dielectric layer having a high dielectric constant is formed. Therefore, the material of the gate dielectric layer 124 may be just a sacrificial material suitable for being removed in later processes. Each of the barrier layers 126 is located on each of the gate dielectric layers 124 to prevent above disposed metals from diffusing downwards to the gate dielectric layer 124 and from polluting the gate dielectric layer 124. Each of the barrier layers 126 may be a single layer structure or a multilayer structure composed of tantalum nitride (TaN) or titanium nitride (TiN) etc. Each of the sacrificial electrode layers 128 may be made of polysilicon, but it is not limited thereto. Each of the cap layers 129 may be a single layer or a multilayer composed of a nitride layer or an oxide layer etc used for being a patterned hard mask, but it is not limited thereto.

An offset (not shown) may be optionally formed on the substrate 110 beside each of the sacrificial gates G1 and G2, wherein the offset (not shown) may be a nitride layer, an oxide layer or an oxynitride layer etc. First spacers 132/134 are formed on the substrate 110 beside the sacrificial gates G1 and G2 respectively to define the positions of lightly doped source/drains in the substrate 110 beside the first spacers 132/134. Two lightly doped source/drains 136/138 are then formed in the substrate 110 beside the two first spacers 132/134 respectively, wherein as the first area A is a PMOS transistor area, the dopants of the lightly doped source/drain 136 may be trivalent ions such as boron ions; as the second area B is a NMOS transistor area, the dopants of the lightly doped source/drain 138 may be pentavalent ions such as phosphorus, depending upon practical needs.

Then, main spacers 142/144 may be formed on the substrate 110 beside the first spacers 132/134 respectively. Each of the main spacers 142/144 may be a single layer spacer or a multilayer spacer, and its cross-sectional profile depends upon practical needs and processing steps. In this embodiment, the main spacers 142/144 are single layers. A source/drain 146/148 is formed in the substrate 110 beside each of the main spacers 142/144, wherein as the first area A is a PMOS transistor area, the dopants of the source/drain 146 may be trivalent ions such as boron ions; as the second area B is a NMOS transistor area, the dopants of the source/drain 148 may be pentavalent ions such as phosphorus, depending upon practical needs.

Optionally, an epitaxial structure 152/154 is formed in the substrate 110 beside each of the main spacers 142/144 as well after the source/drains 146/148 are formed. As the first area A is a PMOS transistor area, the epitaxial structure 152 may be composed of silicon germanium or others; as the second area B is a NMOS transistor area, the epitaxial structure 154 may be composed of silicon carbide or others, depending upon practical needs.

In this case, the epitaxial structures 152/154 overlap the source/drains 146/148 respectively with different overlapping ranges, wherein the epitaxial structure 152 overlaps the whole source/drain 146 and exceeds the source/drain 146, and the epitaxial structure 154 completely overlaps the source/drain 148, but it is not limited thereto. The order of forming the lightly doped source/drains 136/138, the source/drains 146/148 and the epitaxial structures 152/154 is not restricted thereto.

A contact etch stop layer 12 may be optionally formed to cover the sacrificial gates G1 and G2 and the substrate 110. The contact etch stop layer may be a nitride layer or a doped nitride layer having a capability of inducing stresses in the substrate 110 under the sacrificial gates G1 and G2, but it is not limited thereto. A dielectric layer 14 is formed to entirely cover the contact etch stop layer 12, the sacrificial gates G1 and G2 and the substrate 110. In this embodiment, the dielectric layer 14 is an interdielectric layer made of oxide, but it is not limited thereto.

Figure 2:

Thereafter, the dielectric layer 14 is planarized to form a dielectric layer 14a having a flat surface S1 and expose the sacrificial gates G1 and G2, and then the cap layers 129, the sacrificial electrode layers 128 are removed to form recesses R1/R2 while the buffer layers 122, the gate dielectric layers 124 and the barrier layers 126 are preserved as a gate last for a high-k first process is applied in this embodiment, as shown in FIG. 2.

Figure 3:
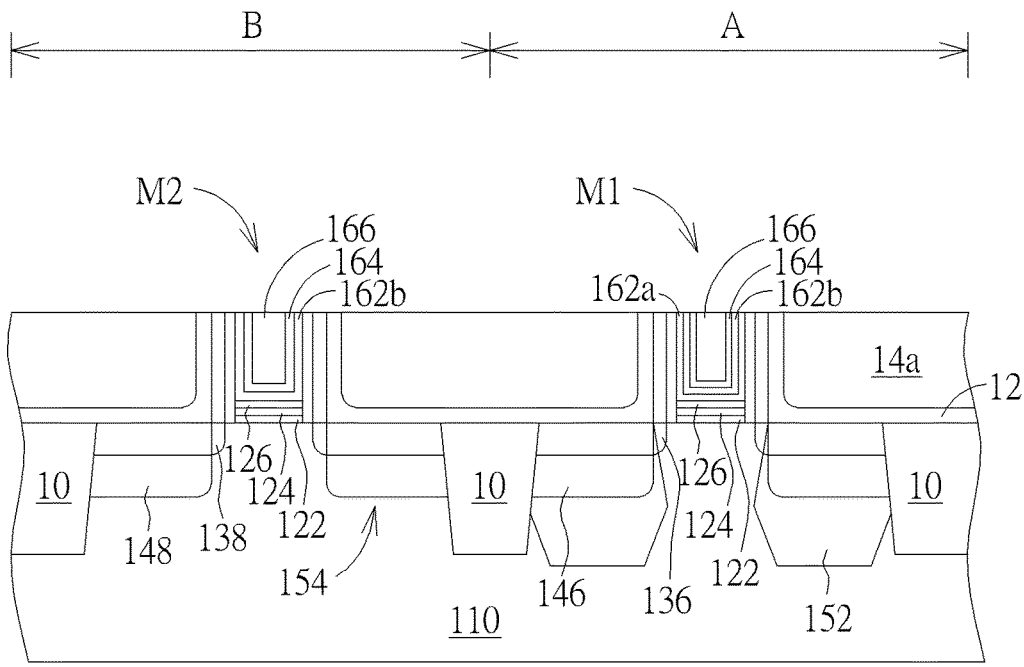

As shown in FIG. 3, metal gates M1/M2 are formed to replace the sacrificial gates G1 and G2 (shown in FIG. 1) by processes such as a replacement metal gate (RMG) process. Thus, multi-metal layers fill into the recesses R1/R2, such that a first work function layer 162a, a second work function layer 162b, a selective buffer layer 164 and a main conductive material 166 may be formed in and fill the recess R1 while a second work function layer 162b, a selective buffer layer 164 and a main conductive material 166 may be formed in and fill the recess R2, thereby forming the metal gates M1/M2. The step of forming the metal gates M1/M2 are known in the art and are not described herein.

The first work function layer 162a may be a single layer or a multilayer structure, composed of titanium nitride (TiN), titanium carbide (TiC), tantalum nitride (TaN) suited for a PMOS transistor, and the second work function layer 162b may be a single layer or a multilayer structure, composed of tantalum carbide (TaC), tungsten carbide (WC), titanium aluminide (TiAl) or aluminum titanium nitride (TiAlN) suited for a NMOS transistor; the selective barrier layer 164 may be a stacked structure composed of titanium nitride (TiN) or tantalum nitride (TaN); the main conductive material 166 may be composed of low resistivity materials such as aluminum, tungsten, titanium aluminum (TiAl) alloy, cobalt tungsten phosphide (CoWP), but the present invention is not restricted thereto.

Figure 4:
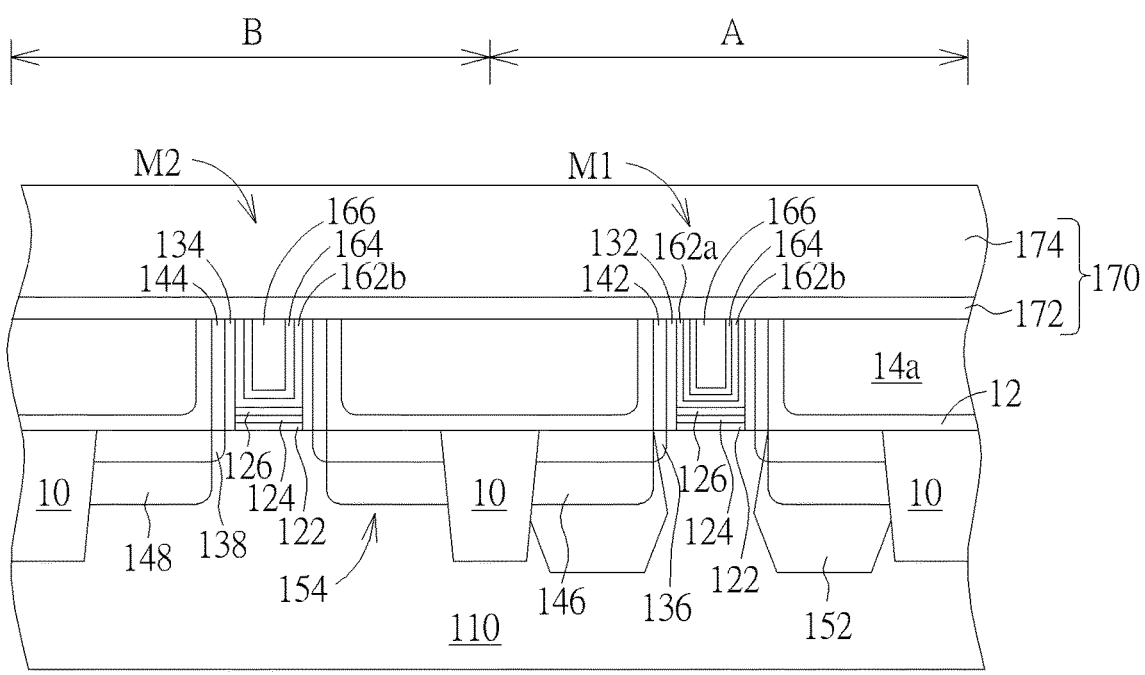

As shown in FIG. 4, a dielectric layer 170 may be formed on the metal gates M1/M2 and the dielectric layer 14a. The dielectric layer 170 may include an oxide layer 172 by using tetraethylorthosilicate (TEOS) as silicon source and an interdielectric layer 174 composed of oxide from bottom to top, but it is not limited thereto.

Figure 5:
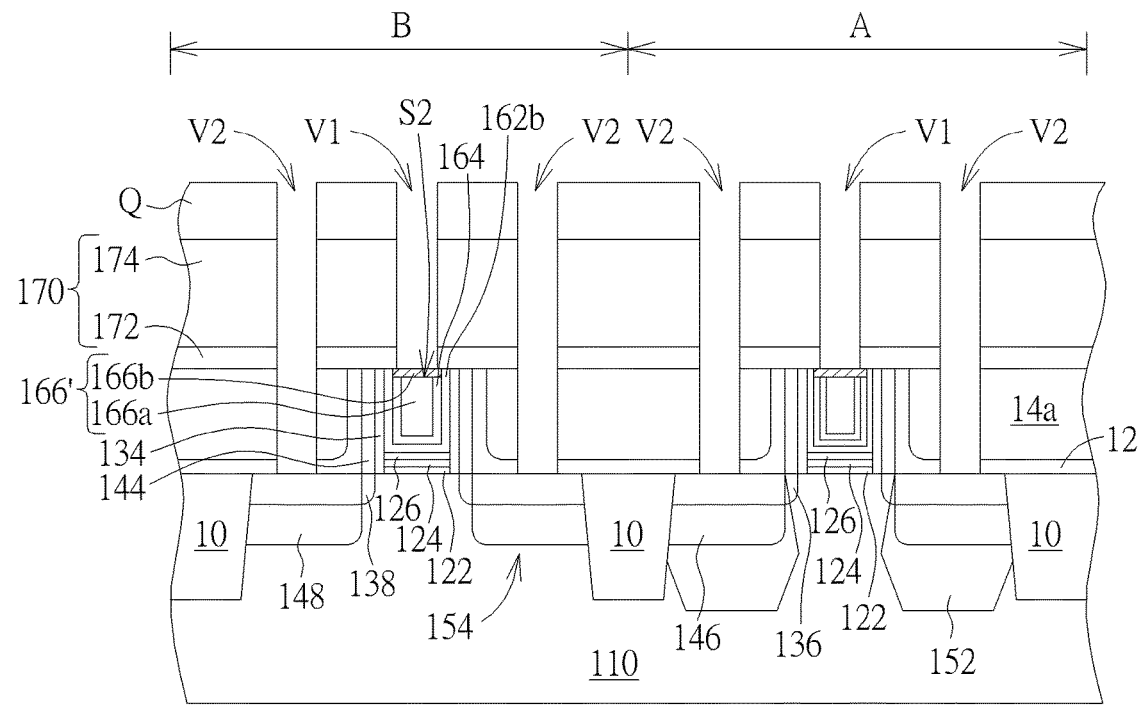

As shown in FIG. 5, the dielectric layer 170 is then patterned to expose the main conductive materials 166. In this embodiment, the dielectric layer 170 is patterned by using a photoresist Q formed by covering and patterning, but it is not limited thereto. Since the main conductive materials 166 are exposed (to the air) while the dielectric layer 170 is patterned, the main conductive materials 166 are oxidized, thereby main conductive materials 166' being formed, such that a metal oxide layer 166b is formed at a top surface S2 of a metal layer 166a, wherein the metal oxide layer 166b and the metal layer 166a have common metal atoms. In one case, as the metal layer 166a is an aluminum layer, the metal oxide layer 166b is an aluminum oxide layer, but it is not limited thereto.

In this embodiment, the dielectric layer 170 is patterned to form contact holes V1/V2. That is, the contact holes V1 expose the metal gates M1/M2, and the contact holes V2 expose the source/drains 146/148. More precisely, the dielectric layer 170 and the dielectric layer 14a are patterned by one single process to form the contact holes V1/V2 at the same time, but it is not limited thereto.

Figure 6:
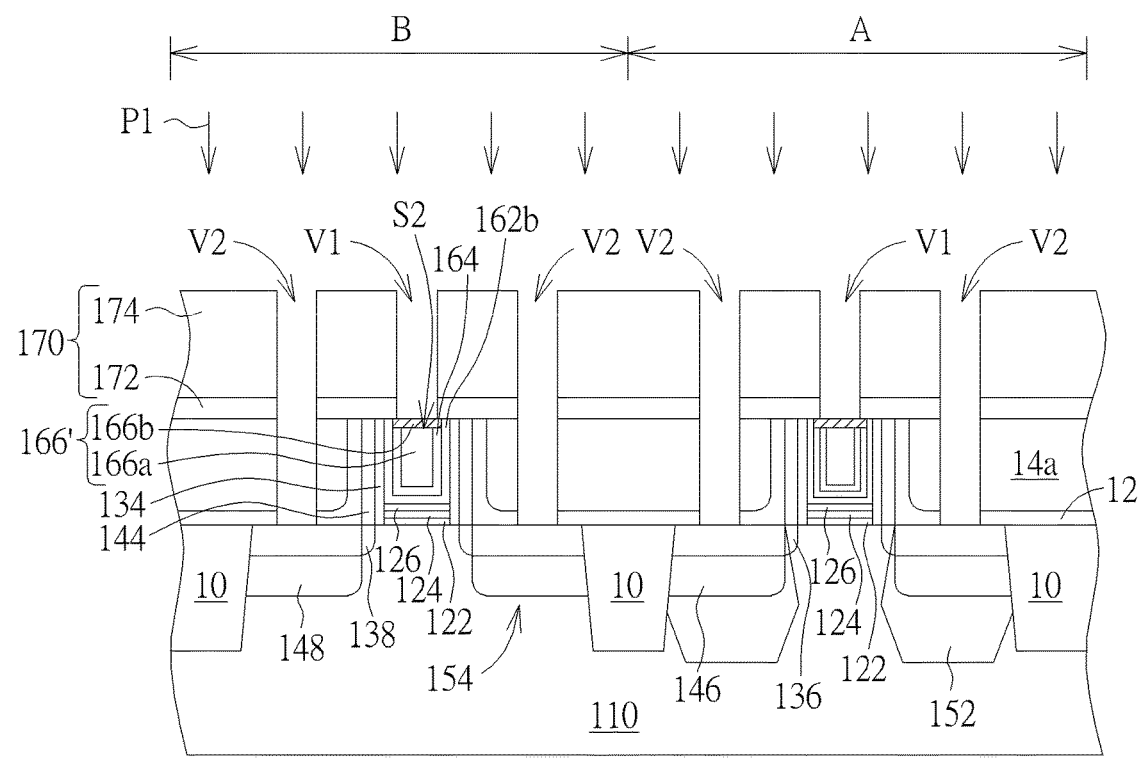

Thereafter, a strip treatment process P1 is performed to remove the photoresist layer Q, as shown in FIG. 6. Preferably, the strip treatment process P1 is an $O_2$ strip treatment process, but it is not limited thereto. In some cases, the strip treatment process P1 may be a first $H_2/N_2$ plasma treatment process, which supplies a gas mixture of $H_2/N_2$ into a processing chamber, and then the gas mixture of $H_2/N_2$ is dissociated to from active $H_2/N_2$ radical plasma to remove the photoresist layer Q, but it is not limited thereto. In this case, the first $H_2/N_2$ plasma treatment process has a $H_2/N_2$ ratio of 4%.

Figure 7:
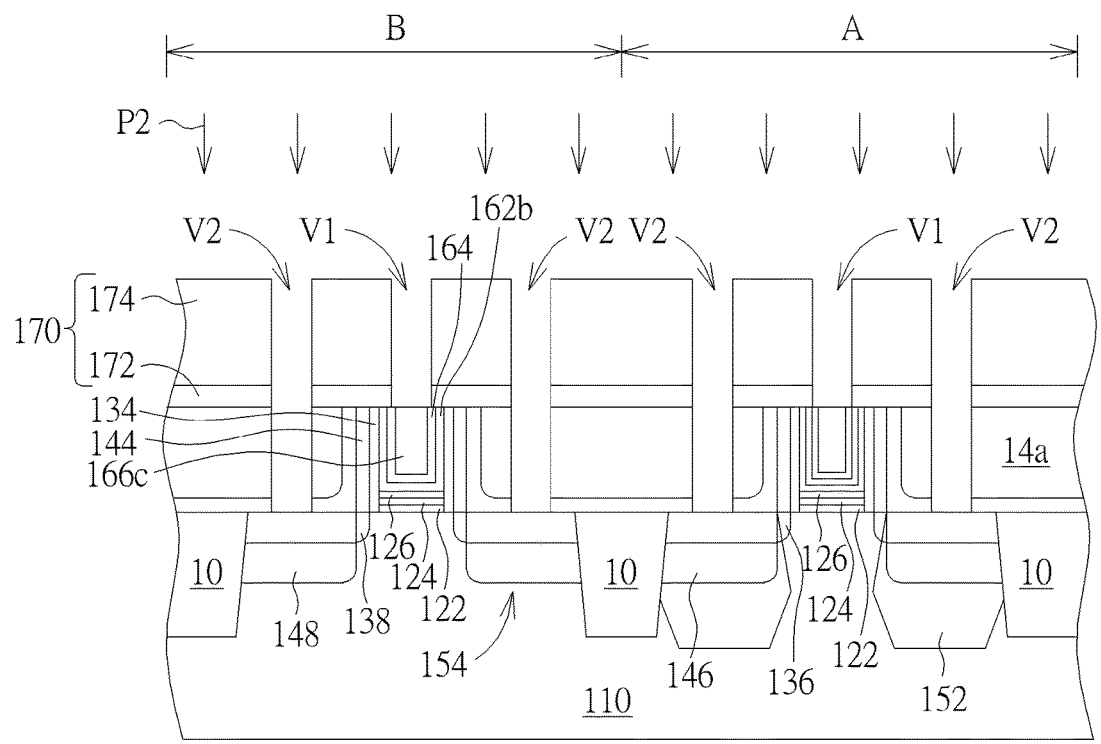

A $H_2/N_2$ plasma treatment process P2 is performed to reduce (or deoxidize) the main conductive materials 166' after the strip treatment process P1 is performed, therefore main conductive materials 166c are formed, as shown in FIG. 7. The main conductive materials 166c are preferably common to the metal layers 166a; that is, the main conductive materials 166c are only composed of metal such as aluminum. More precisely, the metal oxide layers 166b of FIG. 6 are reduced (or deoxidized) into a part of the metal layers 166a of FIG. 6. Due to the main conductive materials 166' being reduced, ohmic contact resistance between the main conductive materials 166c and later formed contact plugs can be reduced.

In a preferred embodiment, the $H_2/N_2$ plasma treatment process P2 supplies a gas mixture of $H_2/N_2$ with a ratio of 2-3.5%. In a still preferred embodiment, the $H_2/N_2$ plasma treatment process P2 supplies a gas mixture of $H_2/N_2$ with a ratio of 2.9%. In one case, the $H_2/N_2$ plasma treatment process P2 inserts an N2 gas while supplying a gas mixture of $H_2/N_2$ for adjusting the concentration of the total gas mixture of $H_2/N_2$. For example, the $H_2/N_2$ plasma treatment process P2 inserts an $N_2$ gas of 1900 sccm while supplying a gas mixture of $H_2/N_2$ with a ratio of 4% of 5000 sccm, but it is not limited thereto.

It is emphasized that, the first $H_2/N_2$ plasma treatment process P1 used for removing the photoresist layer Q has higher $H_2/N_2$ ratio than the $H_2/N_2$ plasma treatment process P2 used for reducing (or deoxidizing) the main conductive materials 166'. As the $H_2/N_2$ ratio is lower, the dissociation rate of a gas mixture of $H_2/N_2$ (dissociated to active $H_2/N_2$ radical plasma) increases, hence the $H_2/N_2$ plasma treatment process P2 can reduce the main conductive materials 166'.

Figure 8:
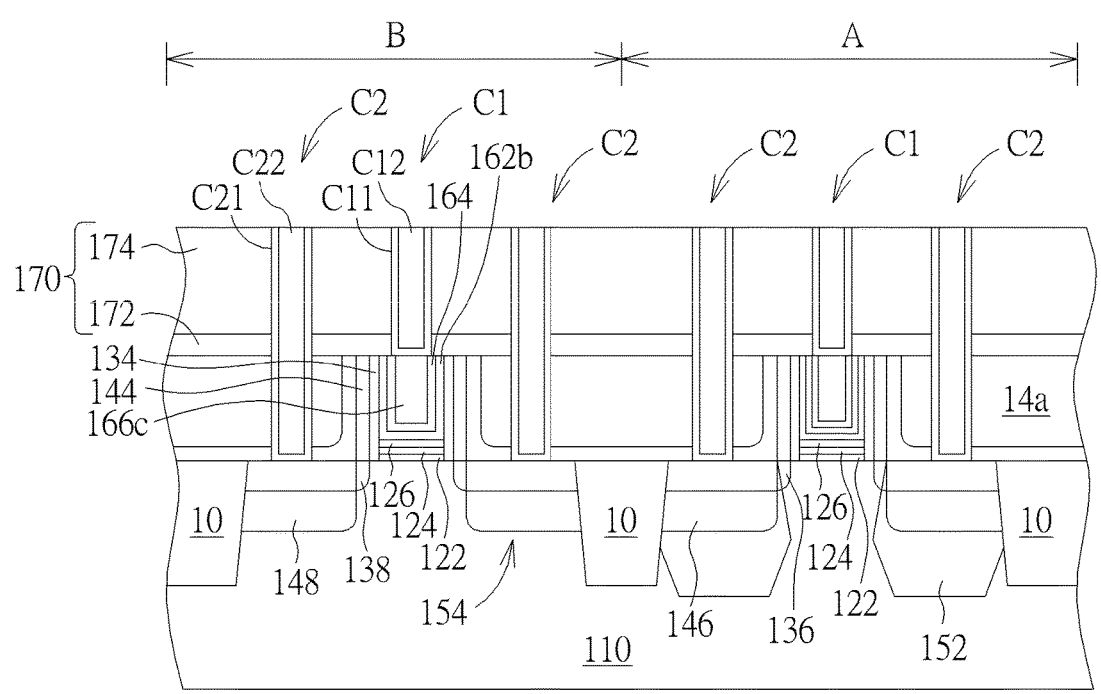

As shown in FIG. 8, contact plugs C1/C2 fill the contact holes V1/V2. That is, the contact plugs C1 fill the contact holes V1 and contact the main conductive materials 166c, and the contact plugs C2 fill the contact holes V2 and being S/D contact plugs contact the source/drains 146/148. In this case, the contact plugs C1/C2 are formed simultaneously and composed of same materials such as copper, tungsten, or others, but it is not limited thereto. Preferably, each of the contact plugs C1/C2 has a barrier layer C11/C21 covering each of the contact holes V1/V2 and a low resistivity material C12/C22 filling each of the contact holes V1/V2. The barrier layer C11/C21 may be a single layer or a multilayer structure composed of tantalum nitride (TaN), titanium nitride (TiN) or others; the low resistivity material C12/C22 may be composed of low resistivity materials such as copper, aluminum, tungsten, titanium aluminum (TiAl) alloy, cobalt tungsten phosphide (CoWP) or others.

Accordingly, the semiconductor process of the present invention for treating metal gates is applied both in the first area A and the second area B at the same time in this embodiment. This means the semiconductor process of the present invention treats the PMOS transistor area and the NMOS transistor for forming a CMOS transistor at the same time. However, the semiconductor process of the present invention can treat metal gates selectively, individually or sequentially, depending upon practical requirements. In addition, the semiconductor process of the present invention can also be applied in other semiconductor devices for reducing oxide of conductors such as metal oxides.

To summarize, the present invention provides a semiconductor process for treating a metal gate, which performs a $H_2/N_2$ plasma treatment process to reduce metal gates, especially for main conductive materials of the metal gates exposed while forming contact holes in a dielectric layer for filling contact plugs therein. Therefore, the present invention reduces ohmic contact resistance between the metal gates and the contact plugs. Preferably, the $H_2/N_2$ plasma treatment process supplies a gas mixture of $H_2/N_2$ with a ratio of 2-3.5%. Still preferably, the $H_2/N_2$ plasma treatment process supplies a gas mixture of $H_2/N_2$ with a ratio of 2.9%. In some case, the $H_2/N_2$ plasma treatment process can be processed by inserting an $N_2$ gas while supplying a gas mixture of $H_2/N_2$ to adjust the concentration of a total gas mixture of $H_2/N_2$, but it is not limited thereto.

The $H_2/N_2$ plasma treatment process is performed after a strip treatment process serving as removing a photoresist layer for patterning the dielectric layer having contact holes therein. The strip treatment process is preferably an $O_2$ strip treatment process, a first $H_2/N_2$ plasma treatment process, or others. The first $H_2/N_2$ plasma treatment process has higher $H_2/N_2$ ratio than the $H_2/N_2$ plasma treatment process applied for reducing the metal gates. That is, the first $H_2/N_2$ plasma treatment process may have a $H_2/N_2$ ratio of 4% while the $H_2/N_2$ plasma treatment process supplies a gas mixture of $H_2/N_2$ with a ratio of 2-3.5%, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for treating a metal gate, comprising:
   providing a metal gate comprising a main conductive material on a substrate;
   performing a H2/N2 plasma treatment process to deoxidize the main conductive material; and
   forming a contact plug contacting the main conductive material after the H2/N2 plasma treatment process is performed.

2. The semiconductor process for treating a metal gate according to claim 1, wherein the main conductive material comprises a metal oxide layer at a top surface of a metal layer.

3. The semiconductor process for treating a metal gate according to claim 2, wherein the metal oxide layer is reduced into a part of the metal layer while the H2/N2 plasma treatment process is performed.

4. The semiconductor process for treating a metal gate according to claim 3, wherein the main conductive material comprises aluminum or tungsten.

5. The semiconductor process for treating a metal gate according to claim 4, wherein the metal oxide layer comprises an aluminum oxide layer while the metal layer comprises an aluminum layer.

6. The semiconductor process for treating a metal gate according to claim 1, wherein the H2/N2 plasma treatment process comprises supplying a gas mixture of H2/N2 with a ratio of 2-3.5%.

7. The semiconductor process for treating a metal gate according to claim 6, wherein the H2/N2 plasma treatment process comprises supplying a gas mixture of H2/N2 with a ratio of 2.9%.

8. The semiconductor process for treating a metal gate according to claim 1, wherein the H2/N2 plasma treatment process comprises inserting an N2 gas while supplying a gas mixture of H2/N2.

9. The semiconductor process for treating a metal gate according to claim 8, wherein the H2/N2 plasma treatment process comprises inserting an N2 gas of 1900 sccm while supplying a gas mixture of H2/N2 with a ratio of 4% of 5000 sccm.

10. The semiconductor process for treating a metal gate according to claim 1, further comprising:
forming a dielectric layer on the metal gate and patterning the dielectric layer to expose the main conductive material by using a photoresist layer and then removing the photoresist layer before the H2/N2 plasma treatment process is performed.

11. The semiconductor process for treating a metal gate according to claim 10, further comprising:
performing a strip treatment process to remove the photoresist layer before the H2/N2 plasma treatment process is performed.

12. The semiconductor process for treating a metal gate according to claim 11, wherein the strip treatment process comprises an O2 strip treatment process.

13. The semiconductor process for treating a metal gate according to claim 11, wherein the strip treatment process comprises a first H2/N2 plasma treatment process having higher H2/N2 ratio than the H2/N2 plasma treatment process.

14. The semiconductor process for treating a metal gate according to claim 13, wherein the first H2/N2 plasma treatment process has a H2/N2 ratio of 4%.

15. The semiconductor process for treating a metal gate according to claim 1, further comprising:
forming a source/drain in the substrate beside the metal gate; and
forming S/D contact plugs directly contacting the source/drain while the contact plug contacting the main conductive material.

\* \* \* \* \*